US006341361B1

(12) United States Patent
Basto et al.

(10) Patent No.: US 6,341,361 B1
(45) Date of Patent: Jan. 22, 2002

(54) GRAPHICAL USER INTERFACE FOR TESTABILITY OPERATION

(75) Inventors: Luis A. Basto, Austin; W. David Dougherty, Roundrock, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/323,653

(22) Filed: Jun. 1, 1999

(51) Int. Cl.[7] .......................... G01R 31/28; G06F 11/00

(52) U.S. Cl. ........................................ 714/726; 714/741

(58) Field of Search ................................. 714/724, 741

(56) References Cited

U.S. PATENT DOCUMENTS

| | | | | | |
|---|---|---|---|---|---|
| 5,633,879 | A | * | 5/1997 | Potts et al. | 714/738 |
| 5,918,037 | A | * | 6/1999 | Tremblay et al. | 716/2 |
| 6,106,568 | A | * | 8/2000 | Beausang et al. | 716/18 |
| 6,141,782 | A | * | 10/2000 | Bombal et al. | 714/738 |

FOREIGN PATENT DOCUMENTS

| | | | | |
|---|---|---|---|---|
| EP | 0 869 433 A2 | * | 10/1998 | G06F/11/00 |
| WO | WO-009855879 A1 | * | 12/1998 | G01R/31/00 |

OTHER PUBLICATIONS

ZYCAD, Test Generation Solutions Using ATPG Software, Accelerators and Services, http://www.zycad.com/products/services/atpgserv.html, Nov. 23, 1998.*
S. D. Collis, The requirements for a VHDL based custom IC, ASIC or FPGA, design process, IEE Colloquium on VHDL (Very High Speed Integrated Circuits Hardware Description Language)—Applications and CAE Advances, (Digest No. 1993/076), 1993, pp.: 1–7.*
M. R. Patel, J. Fierro and S. Pico, I/sub DDQ/test methodology and tradeoffs for scan/non–scan designs, Proceedings. Seventh Asian Test Symposium, 1998, pp.: 138–143.*
Silicon Arena User's Guide, http://www.udai.com/help/, Aug. 10, 1998.*
Rapid Prototyping of Application–Specific Signal Processors (RASSP), CAD System Description, Lockheed Martin Advanced Technology Laboratories, Jun. 1998.*
IEEE Std 1149.1 (JTAG) Testability Primer, Texas Instruments, 1996.*
Test Generation Solutions Using ATPG Software, Accelerators and Services, Zycad Engineering Services, http://www.zycad.com/products/services/atpgserve.html, Nov. 23, 1998, 7 pages.
Silicon Arena User's Guide—Table of Contents, ©1995–97 Unified Design automation, Inc., last modified Sep. 27, 1997, http://www.udai.com/help/, Aug. 10, 1998, 51 pages.
Digital Systems Testing and Testable Design, Revised Printing, Miron Abramovici, Melvin A. Breur, Arthur D. Friedman, IEEE Press, ©1990 by AT&T, 2 cover pages, pp. 370 through 379.
Screen Dump—Graphical User Interface, www.mentor.com, Wilsonville, Oregon, Nov. 5, 1999, 1 page.

* cited by examiner

Primary Examiner—Albert Decady
Assistant Examiner—Joseph D. Torres
(74) Attorney, Agent, or Firm—Akin, Gump, Strauss, Hauer & Feld LLP

(57) ABSTRACT

A graphical user interface (GUI) provides a design engineer the capability of automatically inserting scan logic and test logic into a design. The graphical user interface includes a scan insertion option for a design engineer to invoke a scan insertion tool to check the design for testability. The graphical user interface also permits the design engineer to invoke a test generation tool such as an automatic test pattern generator (ATPG) tool to check the design for fault coverage. The graphical user interface, which can serve as a front end for a design framework, enables a design engineer to efficiently increase testability while still in a design phase.

15 Claims, 9 Drawing Sheets

GRAPHICAL USER INTERFACE FOR TESTABILITY OPERATION

BACKGROUND OF THE INVENTION

1. Field of the Invention

The present invention generally relates to automating testability operation in connection with electronic design automation (EDA) software, and more particularly, to a graphical user interface (GUI) for testability operation.

2. Description of the Related Art

With astonishing regularity over the past several decades, transistors have become smaller and the devices that employ them have become more complex. Today it is not uncommon for an integrated circuit (IC) to contain millions of transistors. The job of designing these ICs has also grown correspondingly more difficult. What was once accomplished by a single individual or a small group of individuals is typically performed by a large team or multiple teams of design engineers.

Although very large scale integration (VLSI) circuits have become more difficult to design, a number of tools have been developed to make the job easier. One class of tools that is makes the job more manageable is called electronic design automation (EDA). Using an EDA tool, a design engineer can break a large circuit into smaller functional units and specify constraints and requirements such as desired inputs and outputs of the functional units. The EDA tool then suggests solutions, often drawing on a vast digital library of possible circuits. In this manner, large circuits are decomposed into more manageable units that can be designed individually, perhaps by groups of design engineers working more or less independently. The result is that the overall design process is significantly faster than it would be otherwise.

For example, Unified Design Automation, Inc. of Austin, Tex. publishes Silicon Arena, a software package that provides, among other things, a graphical synthesis environment in which a design engineer can constrain and synthesize a design using a set of templates for creating logic synthesis command scripts. Information relevant to a specific design may be stored in template files and compiled into a design run as needed. Silicon Arena provides a mechanism for maintaining and sharing synthesis scripts and parameters. Silicon Arena enables a user to create a gate-level netlist (a shorthand description of a schematic indicating connections among logic elements) including Design For Test (DFT) scan chains. In particular, the Silicon Arena synthesis page allows a user to configure synthesis constraints, compile high-level Register Transfer Level (RTL) code which takes into account the constraints, generate data for other teams of design engineers who place and route the design in light of the constraints, and generate schematics used for final circuit layout configuration. Silicon Arena thus gives a user the ability to easily constrain and synthesize a design using a known set of synthesis templates.

As circuits have become increasingly complex, DFT tools have become increasingly important by insuring the ability to test a circuit. Automated test tools such as FastScan and FlexTest both published by Mentor Graphics of Wilsonville, Oreg. have been developed to provide this functionality. During the design process, selected sequential elements such as flip-flops and latches are replaced with their scan equivalent elements. In addition, sets and resets are modified so that they are not asserted during testing, and three-state buses are modified to reduce bus conflicts. Also, an Automatic Test Pattern Generator (ATPG) may generate a set of "scan vectors" to provide a high fault coverage of a circuit. More sophisticated testing procedures that employ scan flip-flops built into the circuit can perform testing at a functional unit level.

As the number of design tools has increased, a design engineer has typically been required to master a separate interface for each tool. This often includes learning interface commands and features for each different tool.

SUMMARY OF THE INVENTION

Briefly, a graphical user interface (GUI) provides a design engineer the capability of automatically inserting scan logic and test logic within a circuit design to be compiled by an electronic design automation (EDA) tool. Through the graphical user interface, a design engineer can invoke a scan insertion tool to check the design for testability and also can invoke a test generation tool to check for fault coverage. The graphical user interface can include a scan insertion option to initiate a scan insertion command script to invoke the scan insertion tool and a test generation option to initiate a test generation tool command script to invoke the test generation tool.

In view of the increased size and complexity of current electronic circuitry, it has become increasingly important to identify faults and test coverage problems in a circuit design as early as possible in the design process. The graphical user interface enables a design engineer to quickly insert scan into a design and identify testability and test coverage problems early in the design phase without the need for detailed knowledge of the scan insertion and test generation tools.

After a design engineer has completed a register transfer level (RTL) design of a design block, the design engineer may enable the scan insertion option during a compile. Subsequently, the design engineer may check for fault coverage by enabling the test generation option.

Prior to development of the following subject matter, there was no GUI for scan insertion. In addition, GUIs for ATPG were non-intuitive and did not interface with the synthesis flow. As a result, design engineers had to write scripts and learn extra commands. The GUI according to the present invention supports different DFT and Synthesis tools from multiple vendors and thus enables a design engineer to use different scan insertion, EDA and ATPG tools from multiple vendors by means of a standard interface, thus creating reproducible results and higher productivity.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF PREFERRED EMBODIMENT

This application is related to the following co-pending, concurrently filed, and commonly assigned U.S. patent application which is hereby incorporated by reference:

U.S. patent application, entitled "Insertion of Scan Hardware" to Luis A. Basto and Mark T. Fox.

Figure 1:
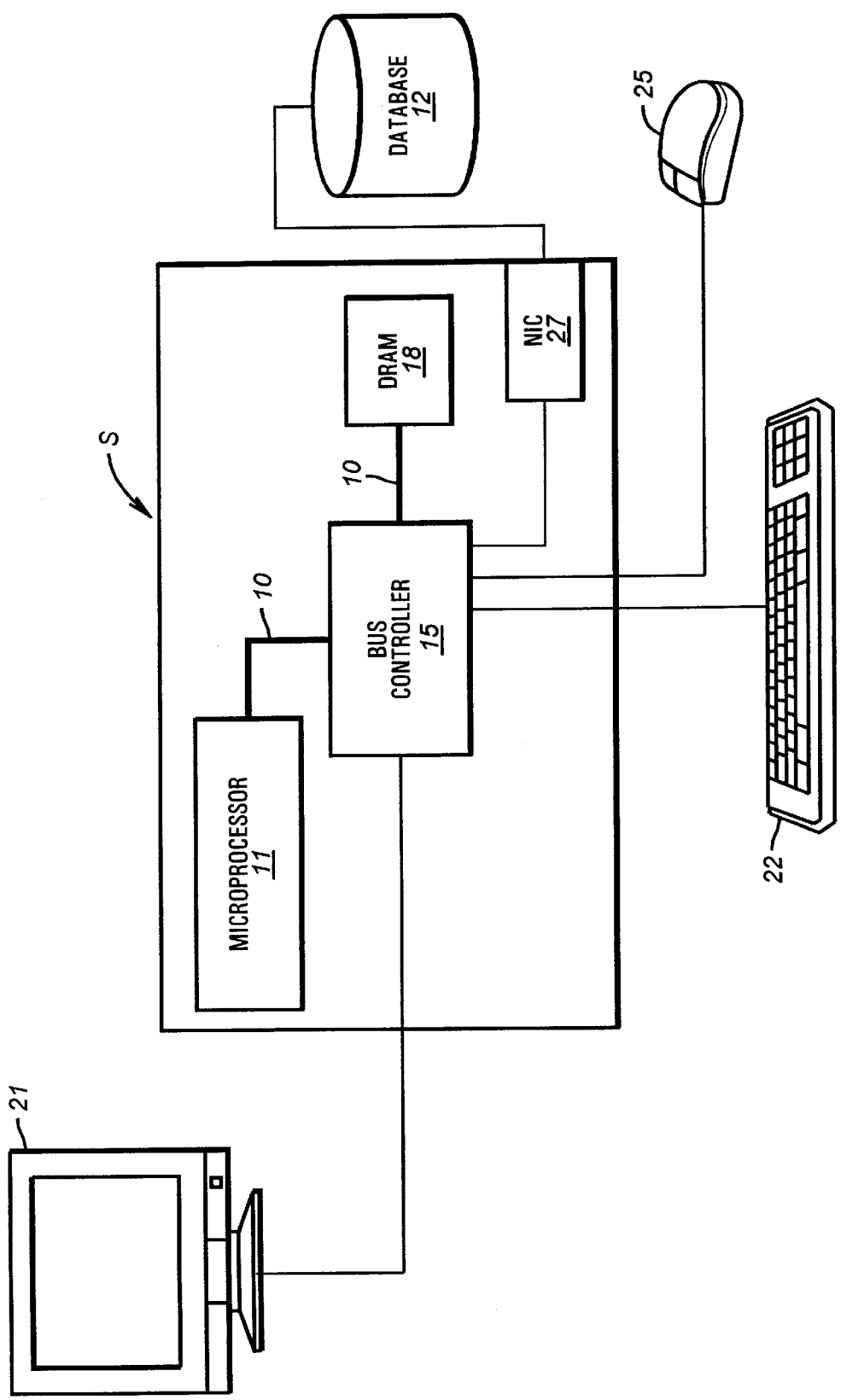
FIG. 1 is a block diagram of a computer system that may employ a graphical user interface (GUI) and methodology in accordance with the present invention.

Turning to FIG. 1, illustrated is a computer system S upon which a graphical user interface (GUI) can be run. The computer system S may be configured around an internal bus 10 connected to a microprocessor 11 and a bus controller 15. Also included within the illustrated computer system S and connected to the bus 10 is a dynamic random access memory (DRAM) or other form of system memory 18. A video display 21, a keyboard 22, a network interface card (NIC) 27 and a mouse or other pointing device 25 are connected to the computer system S through circuitry in the bus controller 15, enabling human interaction with the computer system S. Finally, the NIC 27 is shown coupled through a network to a database 12.

The computer system S is used for illustrative purposes only. The type and nature of the processor 11, the memory 18, and other illustrated hardware components are not critical to the invention. It will be appreciated by those skilled in the art that the disclosed GUI may run on a network.

Figure 2:
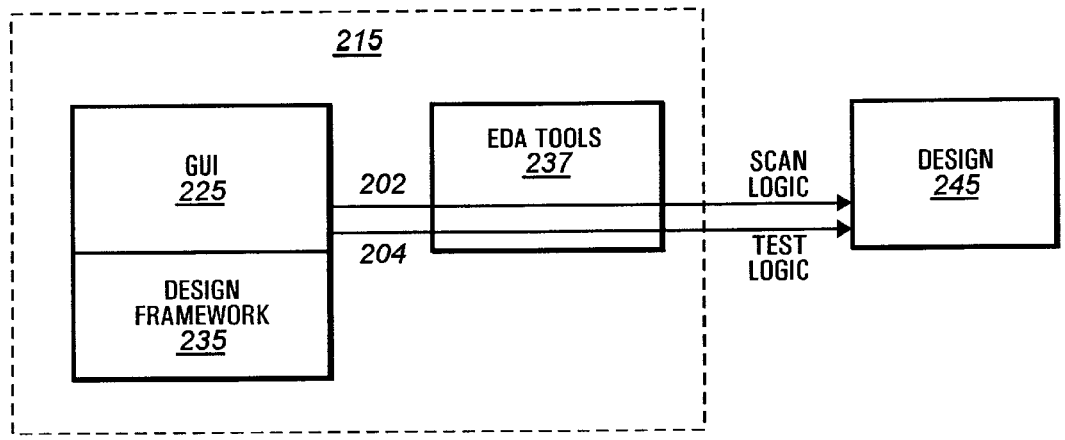
FIG. 2 is a block diagram of a electronic design software package that includes the GUI and methodology of the present invention and a electronic design automation (EDA) tool.

Turning now to FIG. 2, illustrated is a block diagram showing a design software package 215 which includes a graphical user interface (GUI) 225. The software package 215 includes an exemplary design framework 235 such as the version of Silicon Arena available from Unified Design Automation, Inc. or a similar package. The GUI 225 serves as a front end for or an extension to a synthesis page of the design framework 235. As described in detail below, the GUI 225 automates testability operation including design for test (DFT) insertion and test generation. The GUI 225 is here shown inserting scan logic 202 and test logic 204 into a design 245. An example of circuitry which may be used in connection with the GUI 225 is described in the previously incorporated U.S. patent application, entitled "Insertion of Scan Hardware".

A design framework provides a graphical synthesis environment in which a design engineer can constrain and synthesize a design using a set of templates for creating logic synthesis command scripts. Information relevant to a specific design is stored in template files and compiled into a design run as needed. The design framework typically provides a mechanism for maintaining and sharing synthesis scripts and parameters. Also, the design framework enables a user to create a gate-level netlist (a shorthand description of a schematic indicating connections among logic elements) including DFT scan chains. For example, a synthesis page of a design framework allows a user to configure synthesis constraints, compile high-level Register Transfer Level (RTL) code which takes into account the constraints, generate data for other teams of design engineers who place and route the design in light of the constraints, and generate schematics used for final circuit layout configuration. Certain design frameworks thus have given a user the ability to easily constrain and synthesize a design using a known set of synthesis templates.

Figure 3:
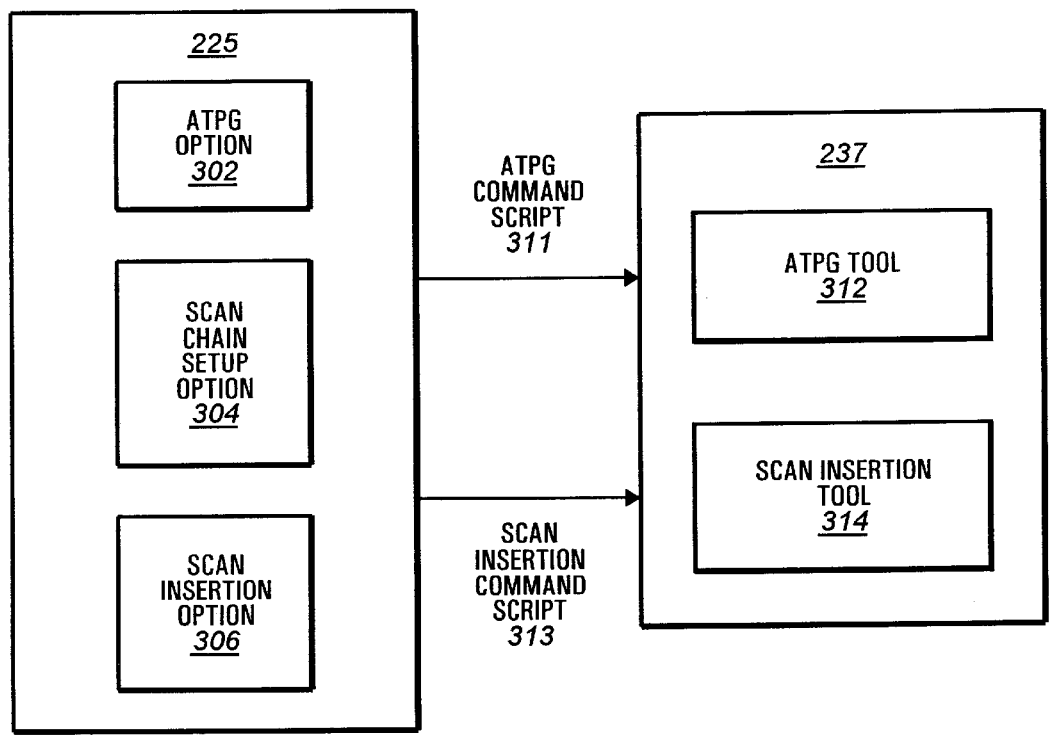
FIG. 3 is a block diagram of the GUI and the EDA tool of FIG. 2 showing components in greater detail.

Turning now to FIG. 3, illustrated are the GUI 225 and EDA tool 237 in greater detail. The GUI 225 includes options to control corresponding EDA tool 237. The GUI options include an Automatic Test Pattern Generator (ATPG) option 302, a Scan Chain Setup option 304, and a Scan Insertion option 306. The selection of the ATPG option 302 of the GUI 225 invokes a corresponding ATPG tool 312 using a test generation command script 311. The enabling of the Scan Insertion option 306 of the GUI 225 invokes a corresponding Scan Insertion option tool 314 using a scan insertion command script 313. The Scan Chain Setup option 304 of the GUI 225, in conjunction with the Scan Insertion option 306, permits the customization of scan insertion. It will be appreciated by those in the art that the GUI 225 may be utilized to invoke EDA tools (which also include DFT tools) other than the Scan Insertion tool 314 and the ATPG tool 312.

Figure 4:
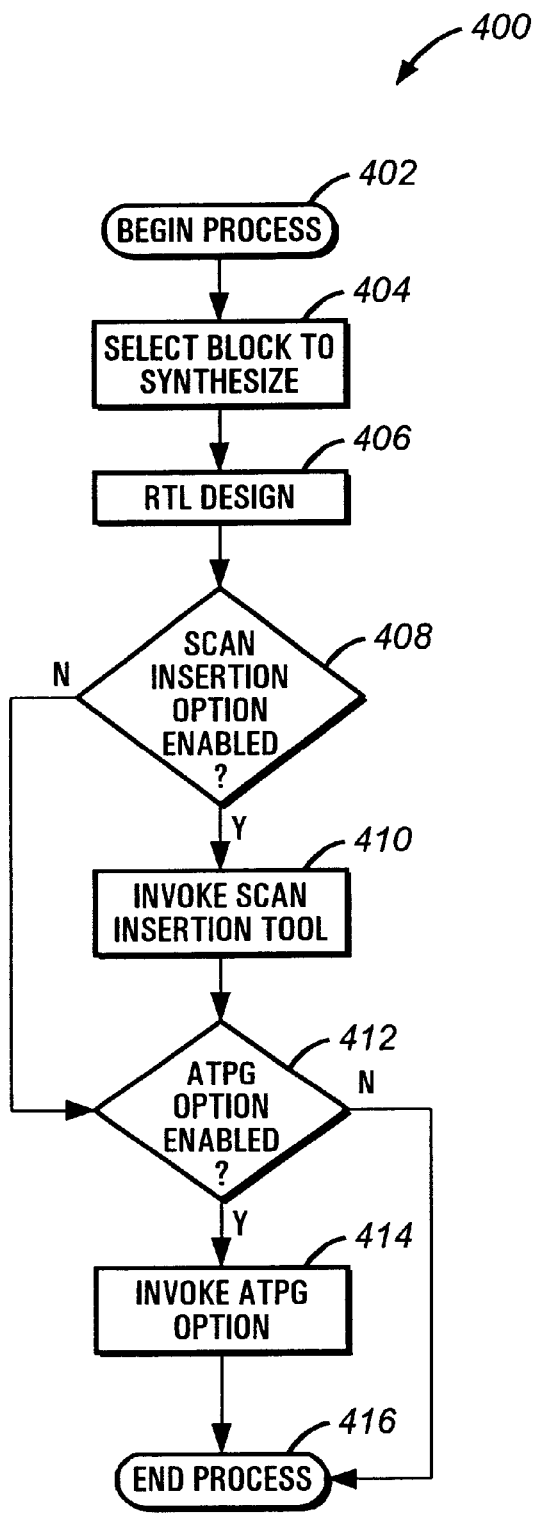
FIG. 4 is a flow chart of a design methodology according to the GUI of FIG. 2.

Turning now to FIG. 4, illustrated is a flow chart of the interaction between the GUI 225 and the EDA tool 237. The process 400 begins in step 402 and proceeds immediately to step 404 where a specific target design block is selected to synthesize. Once the target design block is selected, the process proceeds to step 406 where the design framework 235 performs a register transfer level (RTL) compile. After step 406 is completed, control proceeds to step 408 where a determination is made whether the Scan Insertion Option 306 of the GUI 225 is enabled. If enabled, control proceeds to step 410 where the Scan Insertion tool 314 is invoked and then to step 412. The Scan Insertion tool 314 may be used to insert a scan chain into the design 245. The Scan Insertion tool 314 may also check the design 245 for testability using input constraints provided by a DFT Block Option window 570 (see FIG. 10). If the Scan Insertion Option 306 is disabled, control proceeds immediately to step 412. While the Scan Insertion tool 314 is the scan insertion tool shown, it should be understood that other scan insertion tools may be used. The GUI 225 can be used with different scan insertion, EDA and ATPG tools from multiple vendors, providing a standard interface that eliminates the need for a design engineer to learn and employ multiple GUIs.

In step 412, a determination is made whether the ATPG option 302 of the GUI 225 is enabled. If enabled, control proceeds to step 414 where the ATPG tool 312 is invoked and then to step 416 where processing is completed. If the ATPG option 302 is disabled, control proceeds immediately to step 416 where processing is completed. While ATPG 312 is the test generation tool shown, it should be understood that other test generation tools may alternatively be used. Further, the disclosed tool flow may vary without detracting from the spirit of the invention.

Figure 5:
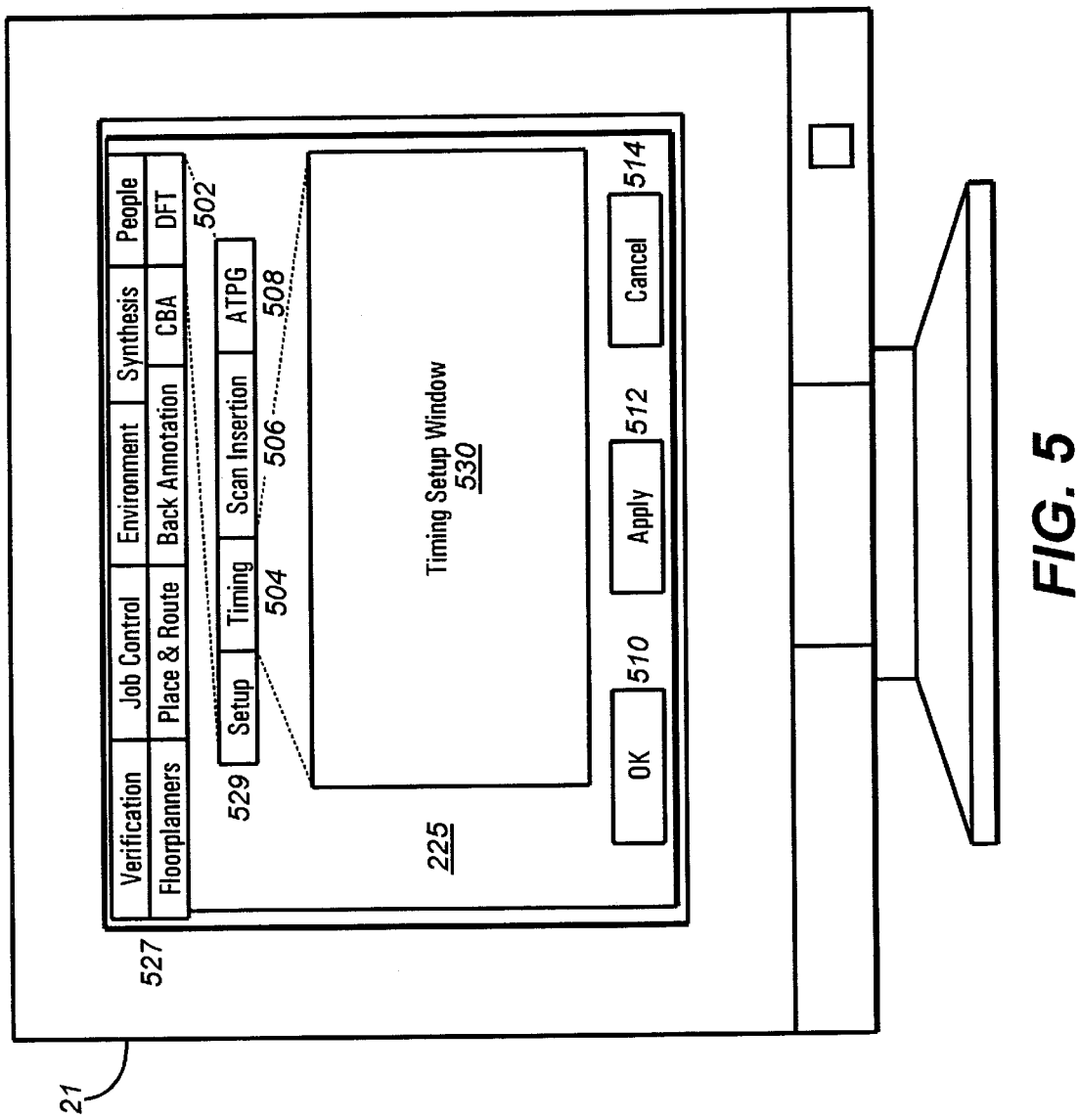
FIG. 5 depicts the video display of FIG. 1 showing an exemplary form of the GUI of FIG. 2.

Turning now to FIG. 5, illustrated is the video display 21 displaying the GUI 225 for the design framework 235 including an EDA option menu 527, a DFT submenu 529 and a Timing Setup window 530. The EDA option menu 527 includes option buttons labeled "Verification," "Job Control," "Environment," "Synthesis," "People," "Floorplanners," "Place & Route," "Back Annotation," "CBA" and "DFT." Except for the DFT option button 502, all the EDA option menu 527 option buttons represent options for the design framework 235 which are not particular to the disclosed embodiment. In this illustration, the DFT submenu 529 is displayed as a result of the selection of the DFT option button 502. The DFT submenu 529 includes option buttons labeled "Setup," "Timing," "Scan Insertion" and "ATPG." Within the DFT submenu 529, a Timing option button 504 of the DFT submenu 529 is shown selected and, as a result, a Timing Setup Window 230 is displayed. If a Scan Insertion option button 506 of the DFT submenu 529 is selected then, a Scan Insertion Setup window 540 (FIG. 7) is displayed instead of the Timing Setup window 530. If an ATPG option button 508 of the DFT submenu 529, then an ATPG Setup window 550 (FIG. 8) is displayed in the GUI 225. The GUI 225 also includes three action buttons 510, 512, and 514 respectively labeled "OK," "Apply" and "Cancel." By positioning the mouse 25 on one of the three action buttons and clicking, an appropriate tool action is performed.

Figure 6:
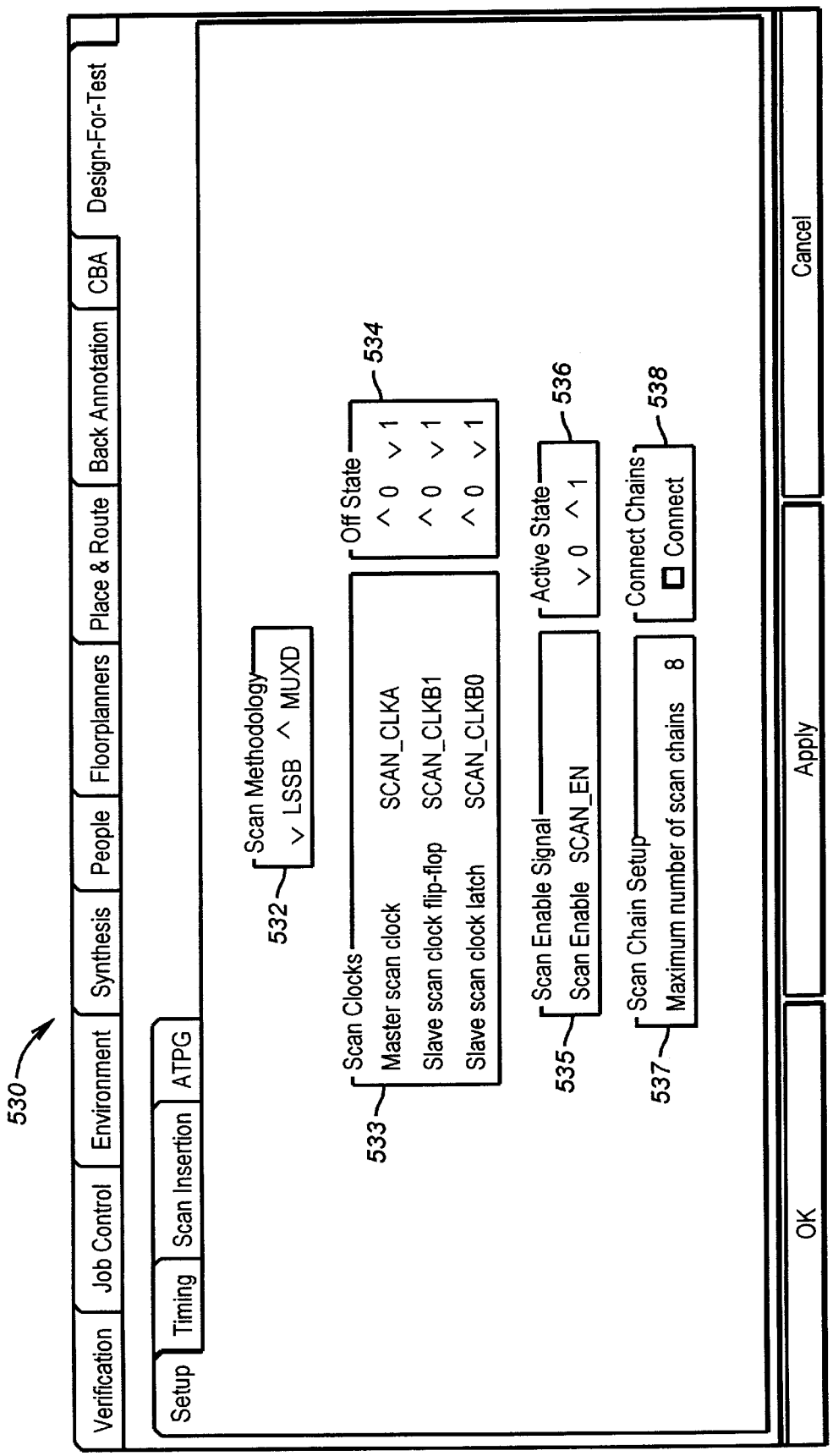
FIG. 6 is an illustration of an exemplary Timing Setup window for the GUI of FIG. 2.

Turning now to FIG. 6, illustrated is a more detailed version of the Timing Setup menu or window 530 which includes a Scan Methodology box 532, a Scan Clocks box 533, a Off State box 534, a Scan Enable Signal box 535, an Active State box 536, a Scan Chain Setup box 537, and a Connect Chains box 538. The Scan Methodology box 532 enables the selection of either a Level Sensitive Scan Design (LSSD) or a Multiplexed-D (MUXD) scan methodology by clicking with the mouse 25 on the corresponding button. The Scan Clocks box 533 enables the selection of a master clock and, in the case of a LSSD methodology, a slave scan clock flip-flop and a slave scan clock latch. In this example, a "SCAN_CLKA" clock is selected as the master scan clock, a "SCAN_CLKB1" clock is selected as the slave scan flip-flop clock, and a "SCAN_CLKB0" clock is selected as the slave scan latch clock.

The Off State box 534 includes three buttons labeled "0" along the left side and three buttons labeled "1" along the right side. A pair of "0" and "1" buttons on a particular row corresponds to the clock selected in the same row of the Scan Clocks box 533. When the "0" button in a particular row is selected, the off state of the respective clock signal is set to active low. When the "1" button is selected, the off state of the respective clock is set to active high. For example, the pair of 0/1 buttons in the top row of the Off State option entry box 534 set the off state of the Master Scan Clock selected in the Scan Clocks box 533 to either active low or active high respectively.

The Scan Enable Signal box 535 controls the enabling and disabling of a scan signal. In this example, the scan signal is set to "SCAN_EN." The Active State box 536 controls whether the scan signal is active high or active low. The button labeled "0" corresponds to an active logical zero signal, and the button labeled "1" corresponds to an active logical one signal. If the Scan Methodology box 532 is set to LSSD, the Scan Enable Signal box 535 and the Active State box 536 are deactivated. If the Scan Methodology box 532 is set to MUX, the Scan Clocks box 533 and the Off State box 534 are deactivated.

The Scan Chain Setup box 537 controls the maximum number of scan chains for the design 245. In this example, the maximum is set to "8." Finally, the Connect Chains box 538 indicates whether the scan chains should be connected or unconnected.

Figure 7:
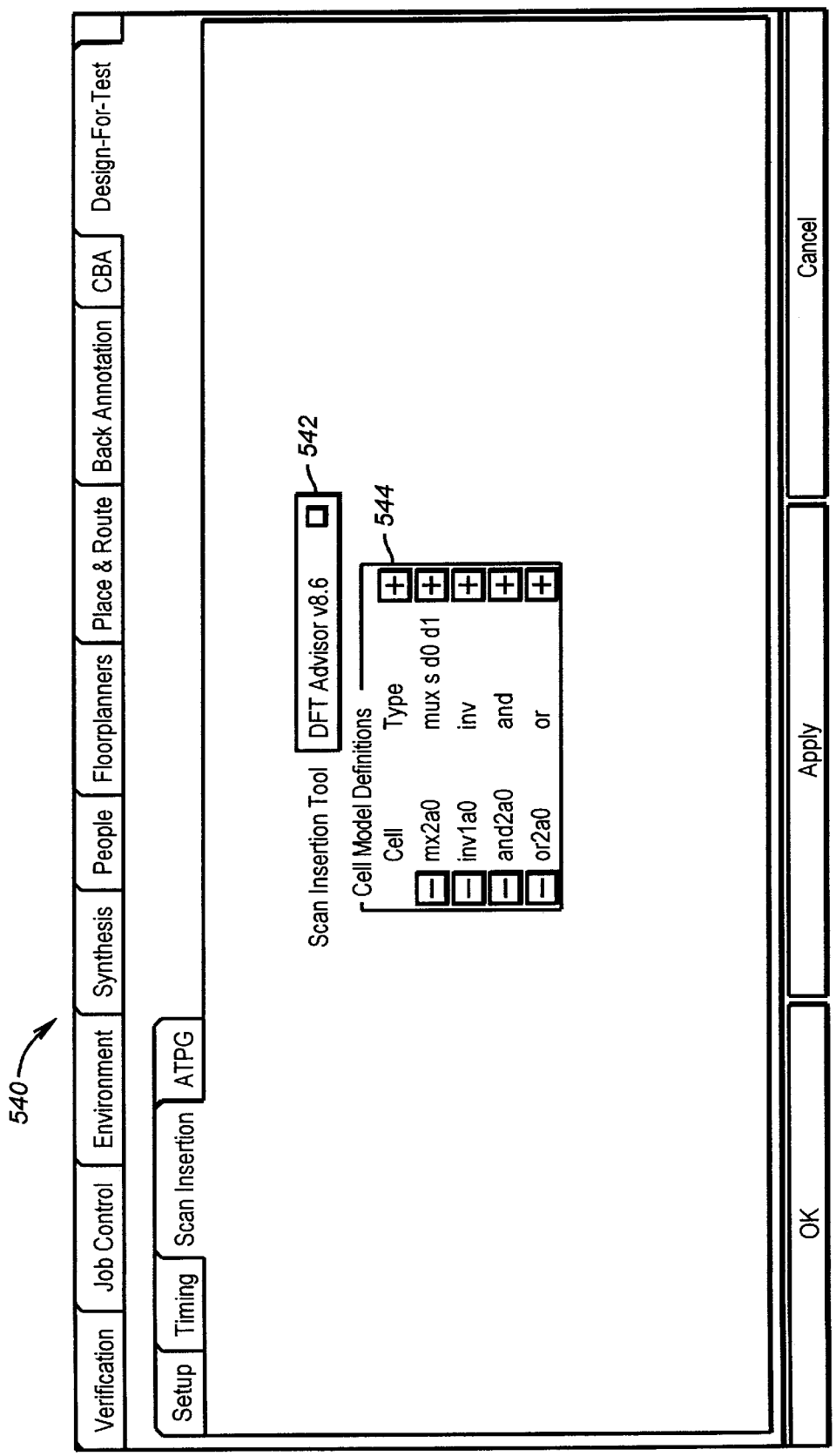
FIG. 7 is an illustration of an exemplary Scan Insertion Setup window for the GUI of FIG. 2.

Turning now to FIG. 7, illustrated is the Scan Insertion Setup menu or window 540 which includes a Scan Insertion Tool box 542 and a Cell Model Definitions box 544. In a manner similar to the displaying of the Timing Setup window 530, the Scan Insertion Setup window 540 is displayed in the GUI 225 by positioning the mouse 25 on the Scan Insertion button of the DFT submenu 529. The Scan Insertion Tool option entry box 542 enables a specific Scan Insertion tool to be selected for use. In this example, the selected Scan Insertion tool is "DFT_Advisor v8.6." The buttons in the Cell Model Definitions box 544 provide four gates, a 2-input multiplexor, an inverter, a logical AND gate and a logical OR gate. This logic can be used by the scan insertion tool 314 for test logic insertion. The windows shown in FIGS. 6 and 7 may be used for setup associated with the Scan Insertion tool 314.

Figure 8:
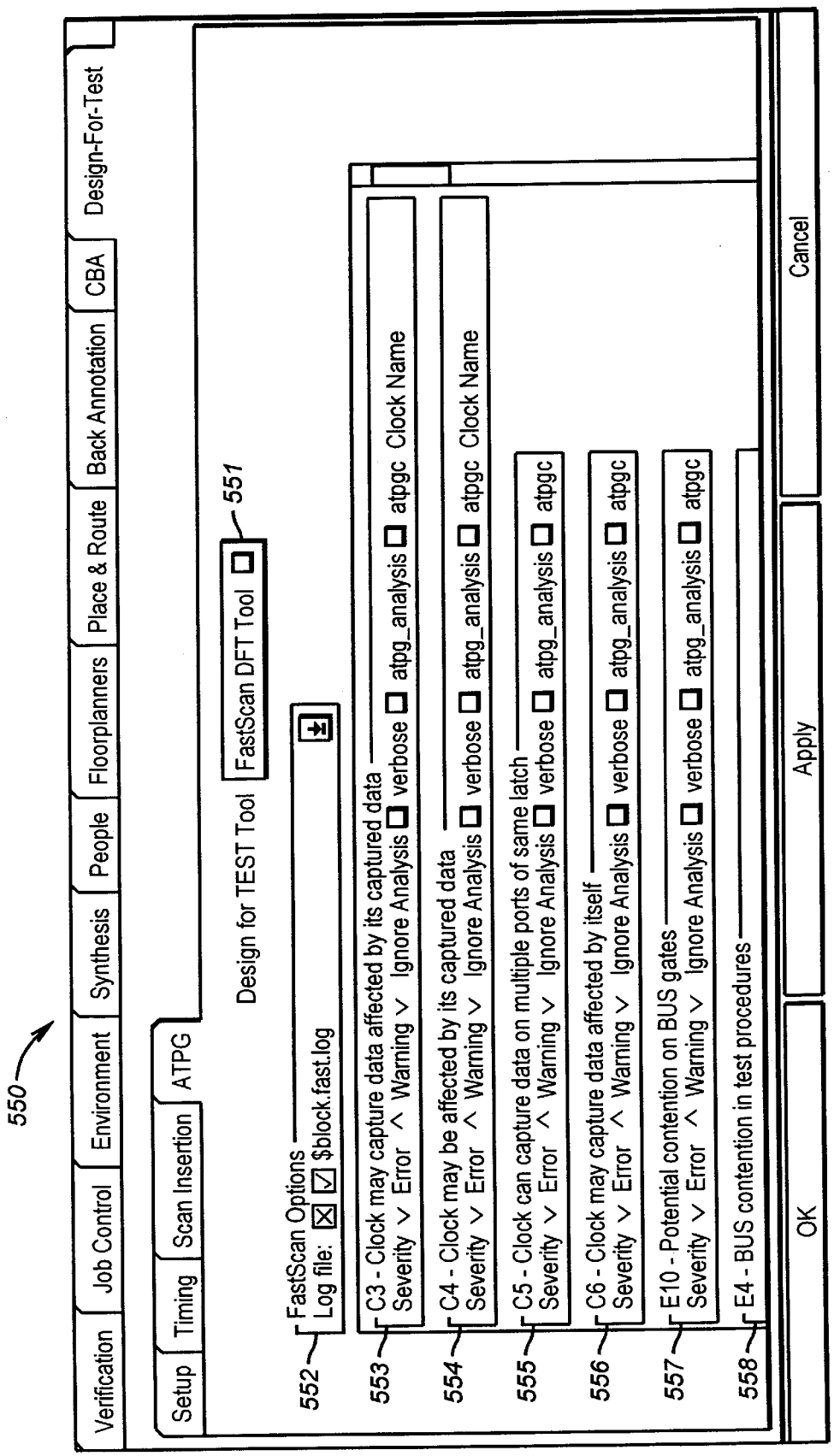
FIG. 8 is an illustration of an exemplary Automatic Test Pattern Generator (ATPG) Setup window for the GUI of FIG. 2.

Turning now to FIG. 8, illustrated is a portion of the ATPG Setup menu or window 550 which includes a DFT Tool box 551, a FastScan Option box 552, four Clock Capture boxes 553–56, a Bus Gate Contention box 557, and a Bus Test Contention box 558. The DFT Tool box 551 enables the selection of a DFT tool that will be employed in a particular session. In this example, the selected DFT tool is "FastScan." The FastScan box 552 enables the selection of the log file to employ in a particular session. In this example, the name of the selected log file is "fast.log" appended to a predefined variable named "block."

The four Clock boxes 553–56 and the Bus Gate Contention box 557 enable the selection of one of several error severity levels, "Error," "Warning" and "Ignore." If an error is detected by one of the clocks corresponding to the Clock boxes 553–56 or a bus gate represented by the Bus Gate Contention box 557, then the error either halts the DFT tool ("Error"), produces a warning and continues ("Warning"), or ignores the error ("Ignore"). The four Clock boxes 553–56 and the Bus Gate Contention box 557 also enable the specification of the type of error messages generated in an appropriate situation. The type of error message generated is one of "verbose," "atpg_analysis" or "atpgc", depending upon the specific option selected for a corresponding clock or bus gate. When the verbose error message type is active, the DFT tools display separate error messages for each rule violation instead of one summary for all violations. When the atpg analysis error message level is active, rule checks require test generation to be turned on for more accurate analysis. When the atpgc error message type is active, the DFT tools use ATPG constraints to analyze appropriate rule checks. In addition, the Clock boxes 553 and 554 contain text entry boxes labeled "Clock Name" that enable the design engineer to specify a particular clock to use for analyzing design rule violations. FIG. 8 only displays a portion of the ATPG Setup window 550. The DFT tools check for many other design rule violations, allowing the design engineer to control the severity and message type levels of the tool.

Figure 9:
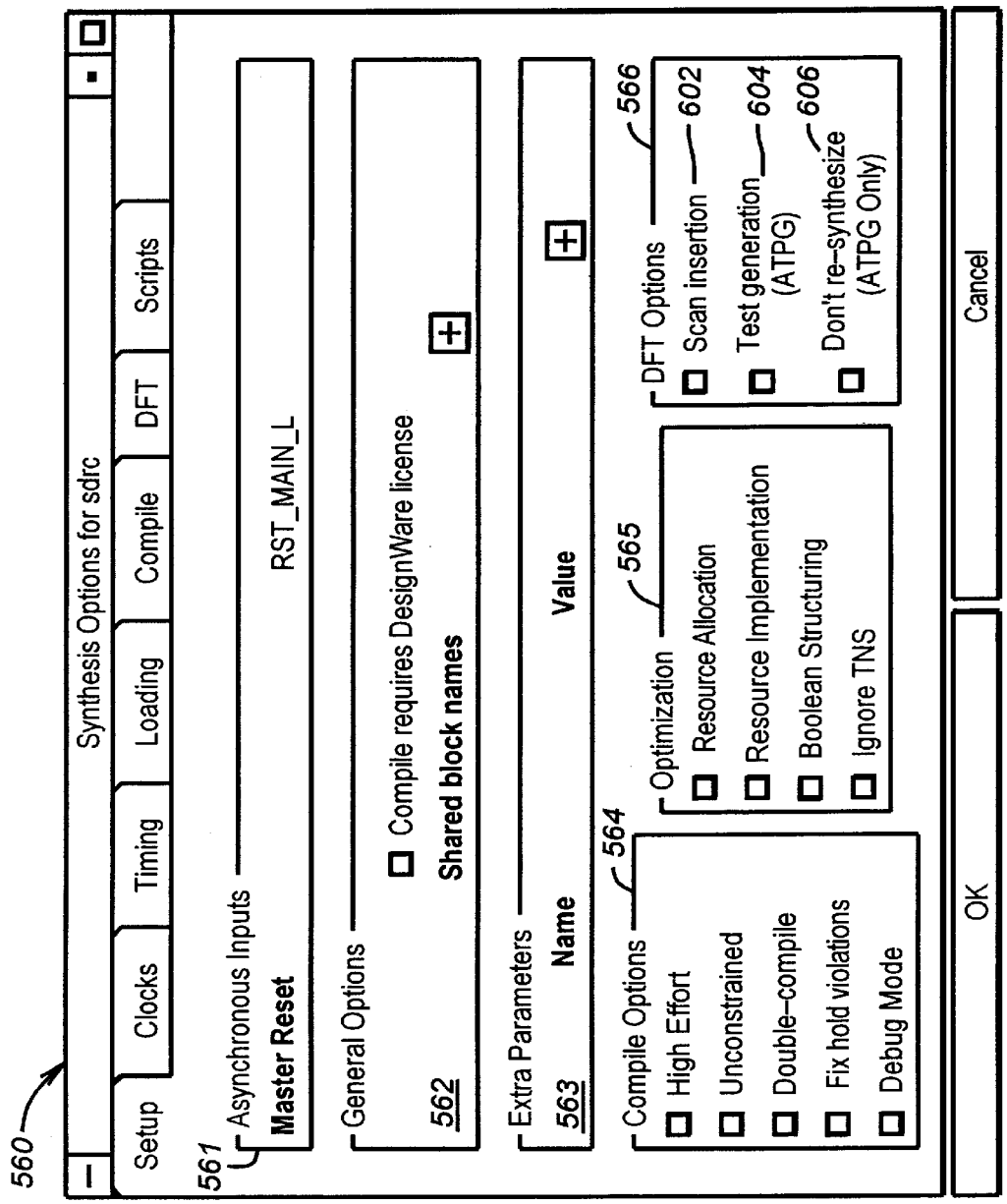
FIG. 9 is an illustration of an exemplary Synthesis Options window for the GUI of FIG. 2.

Turning now to FIG. 9, illustrated is the "Synthesis Options" menu or window 560 which includes an Asynchronous Inputs box 561, a General Options box 562, an Extra Parameters box 563, a Compile Options box 564, an Optimization box 565 and a DFT Options box 566. The Asynchronous Inputs box 561 enables the selection of asynchronous inputs such as a master reset signal. In this example, the selected master reset signal is a RST_MAIN_L signal. The General Options box 562, by clicking with the mouse 25 on a button to the left of a "Compile requires DesignWare license" label, enables the selection of whether a requested compile usage of the EDA tool 235 requires a specific software license. In addition, the General Options box 562 enables the specification of shared block names by clicking with the mouse 25 on a button labeled "+" to the right of a "Shared block names" label.

The Extra Parameters box 563 enables the specification of additional parameters used in compiling by the design framework 235. The Compile Options box 564 enables the selection of several compiler options including "High Effort," "Unconstrained," "Double-Compile," "Fix-Hold violations", and "Debug Mode" options.

The Optimization box 565 enables the selection of several compile optimization options: a "Resource Allocation" optimization, a "Resource Implementation" optimization, a "Boolean Structuring" optimization, and a "Ignore TNS" optimization. Some of the optimization options may be incompatible with others, and the GUI 225, when a specific option is selected, deselects any previously selected options that are incompatible. The DFT Options box 566 enables the selection of several DFT options including a "Scan Insertion" option 602, a "Test generation (ATPG)" option 604 and, if the ATPG option 302 is selected, a "Don't re-synthesize (ATPG only)" option 606. The DFT options 602, 604, and 606 in the DFT Options box 566 are selected by clicking with the mouse 25 on a button to the left of the corresponding label.

Finally, at the bottom of the Synthesis Options window 560 are two buttons labeled "Ok" and "Cancel." Clicking the mouse 25 on the "Ok" button signals the GUI 225 that the data input in the Synthesis Options window 560 is complete and the GUI stores all the selected options in a file. Clicking the mouse 25 on the "Cancel" button causes the GUI 225 to abort the data entry in the Synthesis Options window 560.

Figure 10:
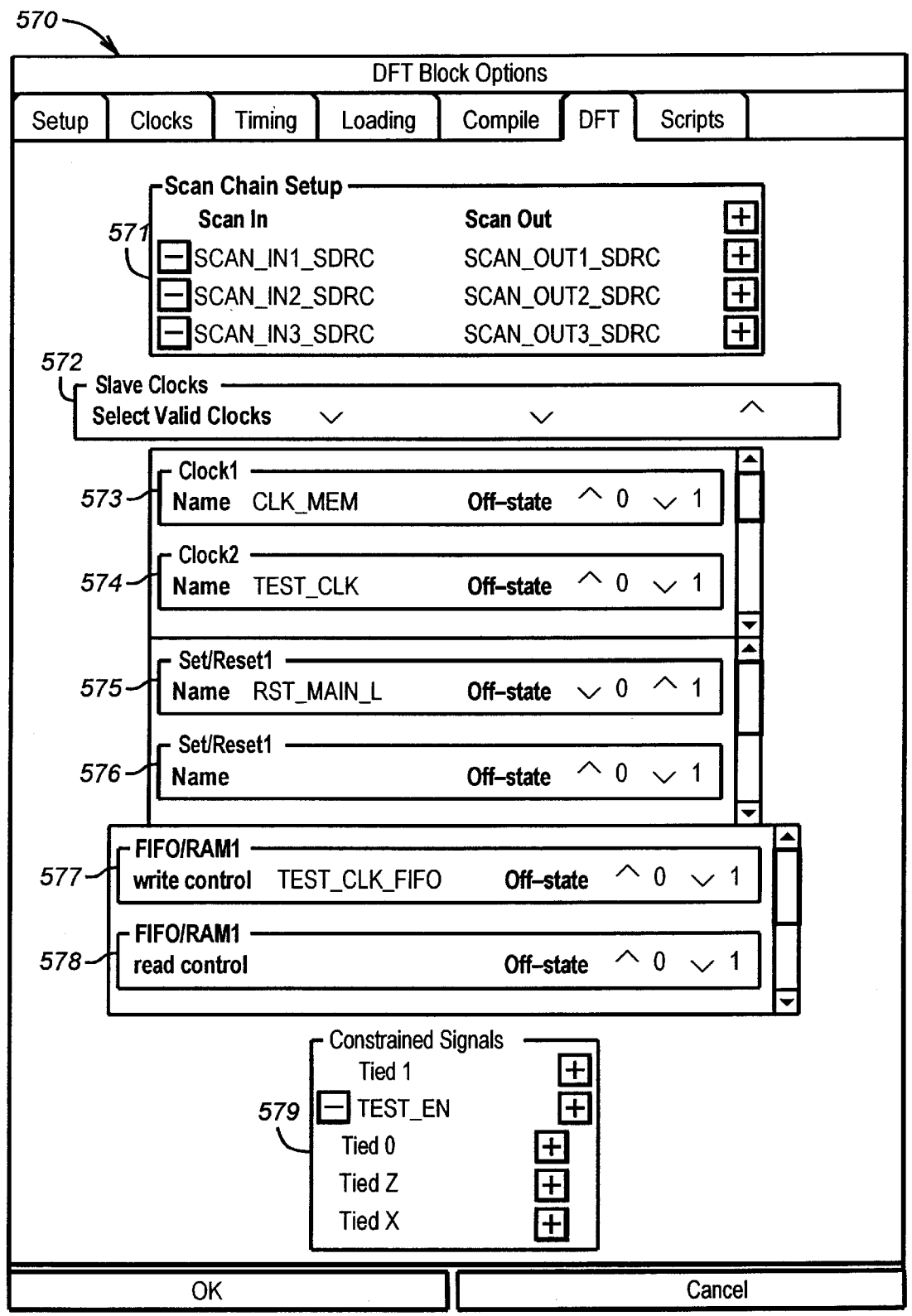
FIG. 10 is an illustration of an exemplary DFT Block Options window for the GUI of FIG. 2.

Turning now to FIG. 10, illustrated is the DFT Block Options menu or window 570 which includes a Scan Chain Setup box 571, a Slave Clocks box 572, a Clock1 box 573, a Clock2 box 574, a Set/Reset1 box 575, a Set/Reset2 box 576, a FIFO/RAM1 Write Control box 577, a FIFO/RAM1 Read Control box 578 and a Constrained Signals box 579. The Scan Chain Setup box 571 contains the names of the scan input and output ports. For multiple scan chains, the "+" buttons to the right of the Scan Out column can be selected with a click of the mouse 25. For a LSSD scan methodology, the Slave Clocks box 572 enables the selection of scanning only flip-flops, latches or both.

The Clock1 box 573 and the Clock2 box 574 enable the selection of a clock signal for the corresponding block. The name of the selected clock signal is entered by positioning the video display 21 cursor over the space to the right of the "Name" label in the respective block and typing the appropriate clock's name by means of the keyboard 22. In this example, the clock signal selected in the Clock1 box 573 is a CLK_MEM signal. The clock signal selected in the Clock2 box 574 is a TEST_CLK signal. More clocks may be entered by scrolling the scroll bar. The Off-state buttons marked "0" and "1" in the Clock1 box 573 and the Clock2 box 574 define whether the respective clock signals have a logically off state of logic zero, "0," or one, "1."

The Set/Reset1 box 575 and the Set/Reset2 box 576 enable the selection of a set/reset signal for the corresponding block. The name of the selected set/reset signal is entered by positioning the cursor 25 over the space to the right of the "Name" label in the respective block and typing, with the keyboard 22, the appropriate set/reset signal's name. In this example, the set/reset signal selected in the Set/Reset1 box 575 is a RST_MAIN_L signal. There is no set/reset signal selected in the Set/Reset2 box 576. The Off-state buttons marked "0" and "1" in the Set/Reset1 box 575 and the Set/Reset2 box 576 determine whether the respective clock signals have a logically off state of logic zero, "0," or one, "1."

The FIFO/RAM1 Write Control box 577 and the FIFO/RAM1 Read Control box 588 enable the selection of a write signal and a read signal for a memory array element of the respective design block. The name of the selected control signal is entered by positioning the cursor 25 in the appropriate text entry box and typing, via the keyboard 22, the name of the selected signal. In this example, the FIFO/RAM1 write control signal is a TEST_CLK_FIFO signal. There is no read control signal defined in the FIFO_RAM1 Read Control box 578. Typically only one write control signal and one read control signal need to be defined in a system design with multiple read/write memory (RAM) units. However, multiple read and write control signals can be defined for multiple RAM designs.

The Constrained Signals box 579 enables the forcing of signals to a certain state for test analysis and generation. For example, the reset input of a flip-flop may be tied high and the set input of the flip-flop may be tied low. A TEST_MODE or SCAN_MODE signal may need to be forced to an active state. The Constrained Signals box 579 also allows signals to be tied to zero ("Tied 0"), high impedance ("Tied Z") or unknown ("Tied X").

Finally, at the bottom of the DFT Block Options window 570 are two buttons labeled "Ok" and "Cancel." Clicking the mouse 25 on the "Ok" button signals the GUI 225 that the data input in the DFT Block Options window 570 is complete and the GUI 225 stores all selected options in a file. Clicking the mouse 25 on the "Cancel" button causes the GUI 225 to abort the data entry in the DFT Block Options window 570.

The Timing Setup window 530 (FIG. 6), the Scan Insertion Setup window 540 (FIG. 7) and the ATPG Setup window 550 (FIG. 8) allow for a setup phase of the design process 400. The Synthesis Options window 560 (FIG. 9) and the DFT Block Options window 570 (FIG. 10) handle data entry for the DFT tools for the design process 400. After the data entry, the logic block that is created by the design process 400 has the scan logic 202 and the associated test logic 204 inserted and checked in response to the options selected and the data entered in the entry windows 530, 540, 550, 560 and 570. If the ATPG option 302 is selected, then test patterns are generated to check for test coverage.

The disclosed methodology and apparatus thus sets up scan and test logic for insertion using an EDA tool. This allows a design engineer to quickly, efficiently and accurately increase testability while still in the design phase of the development process. A system according to the present invention reduces the need to write complicated scan and test scripts by providing a GUI that enables the selection and de-selection of multiple options related to the design process in a one-pass flow. In addition, the settings of the GUI are design block specific, thus providing high configurability. The methodology implemented in the disclosed GUI also provides a substantial productivity improvement in the testability insertion and analysis of a design. A source code appendix is enclosed herein containing exemplary code, written in the Tcl command language, capable of generating the disclosed GUI. Further, the design techniques according to the present invention can be applied to a variety of VLSI circuits.

The foregoing disclosure and description of the preferred embodiment are illustrative and explanatory thereof, and various changes in the synthesis methodology, graphical user interface, variables, number of parameters, order of steps, field sizes, data types, code elements, code size, connections, components, and circuitry, as well as in the details of the illustrated hardware and software and construction and method of operation may be made without departing from the spirit of the invention.

SOURCE CODE APPENDIX

```
lappend borg (packages:dft:list) [ list "flextest" "FlexTest DFT Tool" ]
#--------------------------------------------------------------------------
proc flextest:ShowHelp { } {
exec acroread /usr/local/doc/mentor/cl.pdf/fsft_ref.pdf &
)
#--------------------------------------------------------------------------
traceproc flextest:Initialize { } {
   global borg
   set borg(package:flextest:vendor)      "FlexTest (Mentor Graphics)"
   set borg(package:flextest:cmd)         {flextest $verilog -verilog -lib
$dftlibpath -dof $dofile -log $logfile -replace -nogui}
}
#--------------------------------------------------------------------------
traceproc flextest:SetOptionDefaults { } {
   global borg
   # set borg(system:dft:flextest:cmd) "/tool/mercury-0.2/bin/Links_0.2/
flextest \$verilog -verilog -lib \$dftlibpath -dof \$dofile -log \$logfile
-replace -pt"
   set borg(system:dft:flextest:cmd)      " "
   set borg(system:dft:tool)              " "
   set borg(system:dft:flextest:log)      "\$block.flex.log"
}
#--------------------------------------------------------------------------
traceproc flextest:GetCommand:run {entry {tool "flextest"}} {
   global borg
   set block [ GetEntryName $entry ]
   # Determine logfile directory from scanlog
   if {$tool == "dftadv" || $tool == "dftadv86" } {
   set mode "scan"
   set dofile [NewLocalFile $entry dftdefile]
   set logfile [NewLocalFile $entry scanlog]
   set verilog [file tail [GetLocalFile [MakeFileName $entry scanin]]]
   } else {
   set mode "aft"
   set dofile [NewLocalFile $entry dftatpg]
   set logfile [NewLocalFile $entry scanlog]
   set logfile "[ file dirname $logfile ]/$borg(user:dft:$tool:log)"
   regsub {[\$]block} $logfile "$block" logfile
   set verilog [GetLocalFile [MakeFileName $entry scanout]
   }
   $tool:CreateDofile $entry $block
   if {! [FileExists $dofile]} {
   Diaglog $tool:GetCommand:run \
   "No Dofile"\
   "$tool Dofile not available in local dir."\
   error O {OK}
   tracereturn O
   }
   set scandir [file dirname $logfile]
   # Get the tool commands/environment, with overrides from 'custom'
   # file
   GetLocalVars local
   GetToolEnvironment local env
   set command_list [ BuildEnvironmentCommand [ GetPackageEnviron-
ment
local $mode $tool] ]
   set command [GetPackageCommand local $mode $tool]
   # set command $borg(user:dft:$tool:cmd)
   if {$command == " "} {
   Dialog $tool{:GetCommand:run} \
      "Command is blank"\
      "There is no command specified for tool 'stool'"\
      "in the package environment file."\
      error O {OK}
      tracereturn O
   }
   # Determine MGC_HOME setting from command
   # regexp { ^ (.*)/bin.*} $command match mgc_home
   if [info exists borg(project:libs:dft:system)] {
   set dftlibpath
"$borg(user:libs:dft:system)/$borg(user:libs:dft:name)"
   }
   # Set phony value of MGC_HOME as this will likely be used
   in the tool
   # invocation
   set MGC_HOME {$MGC_HOME}
   eval set command \'$command\'"
```

-continued

SOURCE CODE APPENDIX

```
#" emacs hilit problem
   if [regexp { ^ [ ^ \$].*[\$]} $command] {
   Dialog $tool{:GetCommand:run} \
      "Bad substitution"\
      "$tool command has unsubstituted variables '$command'"\
      error O {OK}
      tracereturn O
   }
   lappend command_list "cd $scandir"
   lappend command_list $command
   tracereturn $command_list
}
#--------------------------------------------------------------------------
proc flextest:ShowOptions {w} {
   global borg
   Debug "flextest:ShowOptions $w"
   set f [ frame $w.dft ]
   pack $f -side top
   set slf [ tixLabelFrame $f.command -label "FlexTest Options" ]
   pack $slf -side top -anchor w
                                  set sf [ $slf subwidget frame
   set bl [ list ]
   lappend bl [ OptionCombo $sf.log "Log file:" dft:flextest:log 40 ]
   eval pack $bl -side top -fill x
   return [ flextest:ShowOptionsDRC $w $f]
}
#--------------------------------------------------------------------------
proc flextest:ShowOptionsDRC {w f} {
   global borg
   # define the available rules and their descriptions.
                                       # index corresponds to rule number
                                       set a_drc [list " " ]
   lappend a_drc "Write control off cannot force RAM write/set/reset
off"
   lappend a_drc "RAM connected to scan clock"
   lappend a_drc "RAM address lines connected to RAM control line"
   lappend a_drc "RAM data lines connected to RAM control line"
   lappend a_drc "RAM connected to RAM"
   lappend a_drc "Uncontrolled RAM during test procedures"
   lappend a_drc "Read control off cannot force RAM read line off"
   set c_drc [list " " ]
   lappend c_drc "Primary clocks cannot force off clocks to scan cells"
   lappend c_drc "Clock cannot capture data with other clocks off"
   lappend c_drc "Clock may capture data affected by its captured data"
   lappend c_drc "Clock may be affected by its captured data"
   lappend c_drc "Clock can capture data on multiple ports of same
latch"
   lappend c_drc "Clock may capture data affected by itself"
   lappend c_drc "Scan cell unable to capture data"
   lappend c_drc "PO connected to clock"
   lappend c_drc "PO connected to clock gated by scan cell using same
clock"
   set d_drc [list " " ]
   lappend d_drc "Scan cell data disturbs"
   lappend d_drc "COPY element failed data capture check"
   lappend d_drc "Master cannot be observed by master"
   lappend d_drc "Unsuccessful skew load procedure for master"
   lappend d_drc "Non-scannable cell conversion (Fastscan only)"
   lappend d_drc "Non-scan cells not transparent"
   lappend d_drc "Clock port of flip"
   lappend d_drc "Master allows data capture with clocks off"
   lappend d_drc "Sequentially transparent cell disturb"
   lappend d_drc "Invalid transparency (Fastscan only)"
   lappend d_drc "Transparent capture cells connected to POs (Fastscan
only)"
   set e_drc [list " " " " " " " " "]
   lappend e_drc "Bus contention in test procedures"
   lappend e_drc "Gate may have observable X"
   lappend e_drc "Multiple memory elements connected to gate"
   lappend e_drc " " " "
   lappend e_drc "Potential contention on WIRE gates"
   lappend e_drc "Potential contention on BUS gates"
   lappend e_drc "BUS gates fail Z state ability"
   lappend e_drc "Test procedures viol~te ATPG constraints"
   set sw [ tixScrolledWindow $f.sw2 -scrollbar auto -height 300 ]
```

-continued

SOURCE CODE APPENDIX

```
        pack $sw -side top
        set f2 [ $sw subwidget window ]
        set sf [DFTDRCNewRule $f2 c3 [lindex $c_drc 3]]
        set bl [DFTDRCSeverity c3 $sf]
        set bl [DFTDRCAnalysis c3 $sf $bl [list "verbose" "atpg_analysis"
   "atpgc"]] lappend bl [DFTDRCClocks c3 $sf ]
        eval pack $bl -side left
        set sf [DFTDRCNewRule $f2 c4 [lindex $c_drc 4]]
        lappend bl [DFTDRCSeverity c4 $sf]
        set bl [DFTDRCAnalysis c4 $sf $bl [list "verbose" "atpg_analysis"
   "atpgc"]] lappend bl [DFTDRCClocks c4 $sf ]
        eval pack $bl -side left
        set sf [DFTDRCNewRule $f2 c5 [lindex $c_drc 5]]
        set bl [DFTDRCSeverity c5 $sf ]
        set bl [DFTDRCAnalysis c5 $sf $bl [list "verbose" "atpg_analysis"
   "atpgc"]] eval pack $bl -side left
        set sf [DFTDRCNewRule $f2 c6 [lindex $c_drc 6]]
        set bl [DFTDRCSeverity c6 $sf ]
        set bl [DFTDRCAnalysis c6 $sf $bl [list "verbose" "atpg_analysis"
   "atpgc"]] eval pack $bl -side left
        set sf [DFTDRCNewRule $f2 e1O [lindex $e_drc 10]]
        set bl [DFTDRCSeverity e1O $sf]
        set bl [DFTDRCAnalysis e1O $sf $bl [list "verbose" "atpg_analysis"
   "atpgc"]] eval pack $bl -side left
        set sf [DFTDRCNewRule $f2 e4 [lindex $e_drc 4]]
        set bl [DFTDRCSeverity e4 $sf]
        set bl [DFTDRCAnalysis e4 $sf $bl [list "verbose" "atpg_analysis"]]
        eval pack $bl -side left
        foreach c [list 1 2 7 8 9] {
            DFTDRCDefault $f2 "c$c" [lindex $c_drc $c]
        }
        foreach d [list 1 2 3 4 5 6 7 8 9 10 11] {
            DFTDRCDefault $f2 "d$d" [lindex $d_drc $d]
        }
        foreach e [list 5 6 9 11 12] {
            DFTDRCDefault $f2 "e$e" [lindex $e_drc $e]
        }
        # Return the frame that has everything that should be clobbered
        # by another choice.
        return $f
}
# The routines below create the dofile for flextest.
#-------------------------------------------------------------------------
traceproc flextest:header { block handle filename {head_only O}} {
        global borg
        puts $handle "// $filename\n//"
        puts $handle "// This file generated by $borg(etc:product)
$borg(etc:version)"
        puts $handle "// Created by [user2fullname $borg(etc:logname)]"
        puts $handle "// Date: [TimeStamp]\n"
        if {$head_only == 0} {
        puts $handle "set log hand $block.log -app"
        puts $handle "set dofile abort off"
        puts $handle "!date >> $block.log"
        }
        return
}
#-------------------------------------------------------------------------
traceproc flextest:clocks { block handle {scan_clks 1}} {
   global borg
   set count 1
   while {$count <= $borg(synth:$block:num_clk)} {
      if [info exists borg(synth:$block:clk$count)] {
         if { $borg(synth:$block:clk$count) != " " } {
            puts $handle "add clock
$borg(synth:$block:offstate_clk$count)
$borg(synth:$block:clk$count)"
         }
      }
      incr count
   }
   # Set / Resets
   set count 1
   while {$count <= $borg(synth:$block:num_reset)} {
      if [info exists borg(synth:$block:reset$count)] {
         if { $borg(synth:$block:reset$count) != " " } {
            puts $handle "add clock
```

-continued

SOURCE CODE APPENDIX

```
$borg(synth:$block:offstate_reset$count)
$borg(synth:$block:reset$count)"
         }
      }
      incr count
   }
   if {$scan_clks == 1 && $borg(user:dft:mode) == "LSSD"} {
      foreach clock [list master_sclk slave_ffclk slave_lclk] {
         # Generates the add clock and add scan commands.
         if [info exists borg(user:dft:$clock)] {
            if {[flextest:SlaveEnabled $block $clock] || $clock
==
master_sclk"} {
                  puts $handle "add clock
$borg(user:dft:off_state_$clock)
$borg(user:dft:$clock)"
            }
         }
      }
   }
   return
}
#-------------------------------------------------------------------------
traceproc flextest:addclkpincon { block handle } {
   global borg
   set count 1
   set type "SR"
   while {#count <= $borg(synth:$block:num_clk)} {
      if [info exists borg(synth:$block:clk$count)] {
         if { $borg(synth:$block:clk$count) != " " } {
            puts $handle "add pin constraint
$borg(synth:$block:clk$count)$type$borg(synth:$block:off-
state_clk$count) 1
1 1"
         }
      }
      incr count
   }
   if {$borg(user:dft:mode) == ..LSSD"} {
      foreach clock [list master_sclk slave_ffclk slave_lclk] {
         # Generates the add clock and add scan commands.
         if [info exists borg(user:dft:$clock)] {
            set type "SR"
            if {$clock == "slave_ffclk"} {
               set type "CR"
            }
            if {[flextest:SlaveEnabled $block $clock] || $clock
== "master_sclk"} {
               puts $handle "add pin constraint
$borg(user:dft:$clock) $type$borg(user:dft:off_state_$clock) 1 1 1"
            }
         }
      }
   }
   return
}
#-------------------------------------------------------------------------
traceproc flextest:addpincon { block handle } {
   global borg
   foreach tied [list O 1 x z] {
      if [info exists borg(synth:$block:tied$tied)] {
         foreach signal $borg(synth:$block:tied$tied) {
            puts $handle "add pin constraint $signal C[string
toupper $tied]"
         }
      }
   }
   return
}
#-------------------------------------------------------------------------
traceproc flextest:fifoclocks { block handle } {
   global borg
   set count 1
   while {$count <= $borg(synth:$block:num_rwctl)} {
      foreach control [list write read] {
         if [info exists borg(synth:$block:$control$count)] {
            if { $borg(synth:$block:$control$count) != " "} {
```

-continued

SOURCE CODE APPENDIX

```
                puts $handle "add $control control
$borg(synth:$block:offstate_$control$count)
$borg(synth:$block:$control$count)"
            }
        }
        incr count
    }
    return
}
#------------------------------------------------------------------------
traceproc flextest:scanchains { block handle {group 1}} {
    global borg
    if {$group} {
        puts $handle "add scan group $borg(user:dft:mode) $block.testproc"
    }
    if [info exists borg(synth:$block:chains:list)] {
        set index 0
        foreach chain $borg(synth:$block:chains:list) {
            set scan_in [lindex $chain 0]
            set scan_out [lindex $chain 1]
            puts $handle "add scan chain $borg(user:dft:mode)$index
$borg(user:dft:mode) $scan_in $scan_out"
            incr index
        }
    } else { Dialog {flextest:atpg} \
        "No scan chains defined."\
        "No scan chains defined."\
        error 0 {OK}
        return 0
    }
    return 1
}
#------------------------------------------------------------------------
traceproc flextest:DRCHandling { block handle {exclude [list]}} {
    global borg
    set arcs [list]
    foreach severity [array names borg "user:dft:sev_*"] {
        regsub ".*_" $severity " " drc
        if {[[search $exclude $drc] == -1} {
            lappend arcs $drc
        }
    }
    foreach drc $drcs {
        puts -nonewline $handle "set drc handling $drc [string tolower
$borg(user:dft:sev_$drc)]"
            foreach anal [list verbose atpg_analysis atpgc] {
                if [info exists borg(user:dft:$drc:$anal)] {
                    if {$borg(user:dft:$drc:$anal)} {
                        puts -nonewline $handle " $anal"
                    }
                }
            }
            if [info exists borg(user:dft:clock_$drc)] {
                if { $borg(user:dft:clock_$drc) != " "} {
                    puts -nonewine $handle " -mode A
$borg(user:dft:clock_$drc)"
                }
            }
            puts $handle " "
    }
    puts $handle "set gate report error_pattern"
    return
}
#------------------------------------------------------------------------
traceproc flextest:CreateDofile { entry block } {
    global borg
    if {! [info exists borg(synth:$block:num_clk)]} {
        Dialog {flextest:CreateDofile} \
            "Block Options not set."\
            "Block ATPG Options are not set. Check Synthesis Block
Options."\ error 0 {OK}
        return 0
    }
    set dofile [NewLocalFile $entry dftatpg]
    set handle [Open4Write $dofile]
    flextest:header $block $handle $dofile
    puts $handle "set test cycle 2"
```

-continued

SOURCE CODE APPENDIX

```
    puts $handle "setup pin constrainst NR 1 0"
    puts $handle "setup pin strobes 1"
    if {$borg(user:dft:mode) == "LSSD"} {
        flextest:fifoclocks $block $handle
    }
    flextest: crocks $block $handle
    flextest:addclkpincon $block $handle
    flextest:addpincon $block $handle
    flextest:scanchains $block $handle
    flextest:DRCHandling $block $handle [list "d5" "d10" "d11"]
    # Specific flextest commands
    puts $handle "set output comparison on"
    puts $handle "set contention check on -atpg"
    puts $handle "set sys mode arc"
    puts $handle "rep drc rules -summary"
    flextest:atpgtail $block $handle [file dirname $dofile]
    close $handle
    flextest:CreateTestProc $entry $block
    flextest:CreateTimePlate $entry $block
    return 1
}
#------------------------------------------------------------------------
traceproc flextest:atpgtail { block handle atpgdir} {
    global borg
    if [FileExists "$atpgdir/custom.atpgeetup.dof"] {
        puts $handle "\ndofile custom.atpgsetup.dof"
    }
    puts $handle "\nset system mode atpg"
    puts $handle "write loops $block.loops -rep"
    puts $handle "add faults -all"
    puts $handle "report statistics"
    if [FileExists "$atpgdir/custom.atpgrun.dof"] {
        puts $handle "dofile custom.atpgrun.dof"
    }
    puts $handle "run"
    puts $handle "report statistics"
    puts $handle "write faults $block.faults -rep"
    puts $handle "save pattern $block.pat -rep"
    puts $handle "save pattern $block.tb.v $block.flextest.timeplate
-varilog -parallel -rep"
    puts $handle "exit"
    return
}
#------------------------------------------------------------------------
proc flextest:SlaveEnabled { block clock } {
    global borg
    if { $borg(user:dft:$clock) == $borg(synth:$block:slaves) || \
$borg(synth:$block:slaves) == "Both"} {
        return 1
    } else {
        return 0
    }
}
#------------------------------------------------------------------------
traceproc flextest:CreateTestProc { entry block } {
    global borg
    set tproc [NewLocalFile $entry dfttproc]
    set handle [Open4Write $tproc]
    flextest:header $block $handle $tproc 1
    puts $handle "procedure shift ="
    puts $handle " force_sci 0;"
    puts $handle " measure_sco $borg(user:dft:tim_strobe);"
    # Output force statements based on timing
    set forces [list]
    if {$borg(user:dft:mode) == "LSSD"} {
        set state $borg(user:dft:off_state_master_sclk)
        set state_bar [expr {$state == 1 ? O : 1}]
        1append forces [list $borg(user:dft:tim_onclka)
$borg(user:dft:master_sclk) $state_bar]
        lappend forces [list $borg(user:dft:tim_offclka)
$borg(user:dft:master_sclk) $state]
        if [flextest:SlaveEnabled $block "slave_ffolk"] {
            set state $borg(user:dft:off_state_slave_ffclk)
            set state_bar [expr {$state == 1 ? O : 1}]
            lappend forces [list $borg(user:dft:tim_onclkb)
$borg(user:dft:slave_ffclk) $state_bar]
            lappend forces [list $borg(user:dft:tim_offclkb)
```

SOURCE CODE APPENDIX
-continued

```
$borg(user:dft:slave_ffclk) $state]
    }
    if [flextest:SlaveEnabled $block "slave_lclk"] {
        set state $borg(user:dft:off_state_slave_lclk)
        set state_bar [expr {$state == 1 ? O : 1}]
        lappend forces [list $borg(user:dft:tim_onclkb)
$borg(user:dft:slave_lclk) $state_bar]
        lappend forces [list $borg(user:dft:tim_offclkb)
$borg(user:dft:slave_lclk) $state]
    }
} else {
    set count 1
    while {$count <= $borg(synth:$block:num_clk}} {
        if [info exists borg(synth:$block:clk$count)] {
            if { $borg(synth:$block:clk$count) != " " } {
                set state
$borg(synth:$block:offstate_clk$count)
                set state_bar [expr {$state == 1 ? O : 1}]
                lappend forces [list
$borg(user:dft:tim_oncapture)
$borg(synth:$block:clk$count) $state_bar ]
            }
        }
        incr count
    }
    set count 1
    while {$count <= $borg(synth:$block:num_clk)} {
        if [info exists borg(synth:$block:clk$count)] {
            if { $borg(synth:$block:clk$count) != " " } {
                set state
$borg(synth:$block:offetate_clk$count)
                set state_bar [expr {$state == 1 ? O : 1}]
                lappend force [list
$borg(user:dft:tim_offcapture)
$borg(synth:$block:clk$count) $state ]
            }
        }
        incr count
    }
}
foreach force [[sort $forces] {
    puts $handle " force [[index $force 1] [[index $force 2]
[[index
$force 0];"
}
puts $handle " period $borg(user:dft:tim_period);"
puts $handle "end;\n"
puts $handle "procedure load_unload =~'
set count 1
# Clocks
while {$count <= $borg(synth:$block:num_clk)} {
    if [info exists borg(synth:$block:clk$count)] {
        if { $borg(synth:$block:clk$count) != " " } {
            puts $handle " force $borg(synth:$block:clk$count)
$borg(synth:$block:offetate_clk$count) 0;"
        }
    }
    incr count
}
set count 1
# Set / Resets
while {$count <= $borg(synth:$block:num_reset)} {
    if [info exists borg(synth:$block:reset$count)] {
        if { $borg(synth:$block:reset$count) != " " } {
            puts $handle " force
$borg(synth:$block:reset$count)
$borg(synth:$block:offstate_reset$count) 0;"
        }
    }
    incr count
}
# FIFO'S
set count 1
while {$count <= $borg(synth:$block:num_rwct1)} {
    foreach control [list write read] {
        if [info exists borg(synth:$block:$control$count)] {
            if { $borg(synth:$block:$control$count) != " " } {
                puts $handle " force
                    $borg(synth:$block:$control$count)
$borg(synth:$block:offstate_$control$count) 0;"
            }
        }
    }
    incr count
}
if {$borg(user:dft:mode) == "MUXD"} {
    puts $handle " force $borg(user:dft:scan_enable)
$borg(user:dft:active_low_scan_enable) 0;"
} else {
    puts $handle " force $borg(user:dft:master_sclk)
$borg(user:dft:off_state_master_sclk) 0;"
    if [flextest:SlaveEnabled $block "slave_ffclk"] {
        puts $handle " force $borg(user:dft:slave_ffalk) O O.;"
    }
    if [flextest:SlaveEnabled $block "slave_lclk"] {
        puts $handle " force $borg(user:dft:slave_lclk) 0 0;"
    }
}
puts $handle " apply shift 100 l;"
puts $handle " period $borg(user:dft:tim_period);"
puts $handle "end;\n"
if {$borg(user:dft:mode) == "LSSD"} {
    puts $handle "procedure master_observe ="
    set count 1
    while {$count <= $borg(synth:$block:num_clk)} {
        if [info exists borg(synth:$block:clk$count)] {
            if { $borg(synth:$block:clk$count) != " " } {
                puts $handle " force
$borg(synth:$block:clk$count)
$borg(synth:$block:offstate_clk$count) 0;"
            }
        }
        incr count
    }
    set count 1
    while {$count <= $borg(synth:$block:num_reset)} {
        if [info exists borg(synth:$block:reset$count)] {
            if { $borg(synth:$block:reset$count) != " " } {
                puts $handle " force
$borg(synth:$block:reset$count)
$borg(synth:$block:offstate_reset$count) 0;"
            }
        }
        incr count
    }
    puts $handle " force
$borg(user:dft:master_sclk)$borg(user:dft:off_state_master_sclk) 0;"
    # Output force statements based on timing.
    set forces [list]
    if [flextest:SlaveEnabled $block "slave_ffclk"] {
        lappend forces [list O $borg(user:dft:slave_ffclk)]
        lappend forces [list
            $borg(user:dft:tim_onclkb)$borg(user:dft:slave_ffclk)]
        lappend forces [list
$borg(user:dft:time_offclkb)$borg(user:dft:slave_ffclk)]
    }
    if [flextest:SlaveEnabled $block "slave_lclk"] {
        lappend forces [list O $borg(user:dft:slave_lclk)]
        lappend forces [list
            $borg(user:dft:tim_onclkb)$borg(user:dft:slave_lclk)]
        lappend forces [list
            $borg(user:dft:tim_offclkb)$borg(user:dft:slave_lclk)]
    }
    foreach force [[sort $forces] {
        puts $handle " force [[index $force 1] 0 [[index $force 0];"
    }
    puts $handle " period $borg(user:dft:tim_period);" puts $handle
"end;\n"
    }
    close $handle
    return 1
}
#------------------------------------------------------------
```

-continued

SOURCE CODE APPENDIX

```
traceproc flextest:CreateTimePlate { entry block } {
    global borg
    set tplate [NewLocalFile $entry dfttplate]
    set root [file rootname $tplate]
    set ext [file extension $tplate]
    set tplate "$root.flextest$ext"
    set handle [Open4Write $tplate]
    flextest:header $block $handle $tplate 1
    set period $borg(user:dft:tim_period)
    puts $handle "set cycle time $borg(user:dft:tim_period);"
    puts $handle "set first_force time 0;"
    puts $handle "set force time [expr int( $period * 0.1) ] [expr int( $period * 0.4)];"
    puts $handle "set measure time [expr int( $period * 0.1) -1] [expr int($period * 0.4)-1];"
    puts $handle "set time scale 1 ns;"
    close $handle
    return 1
}
```

We claim:

1. A computer-implemented graphical user interface (GUI) for testability operation, the GUI comprising:
   a design for test (DFT) menu, comprising:
      a scan insertion option to invoke a scan insertion tool to check a design for testability; and
      a test generator option to invoke a test generation tool to check the design for fault coverage.

2. The GUI of claim 1, wherein the test generation tool is an automatic test pattern generator (ATPG) tool.

3. The GUI of claim 1, further comprising:
   a scan insertion setup option to perform setup configuration for the scan insertion tool.

4. A computer-implemented testability operation software, comprising:
   a scan insertion tool;
   a test generation tool; and
   a testability operation graphical user interface (GUI), the GUI comprising:
      a design for test menu, comprising:
         a scan insertion option to invoke the scan insertion tool to check a design for testability; and
         a test generator option to invoke a test generation tool to check the design for fault coverage.

5. The software of claim 4, wherein the test generation tool comprises an automatic test pattern generator (ATPG) tool.

6. The software of claim 4, wherein the scan insertion tool and the test generation tool are from different vendors.

7. The software of claim 4, further comprising:
   a design framework coupled to the graphical user interface.

8. A method of testability operation using a computer implemented graphical user interface (GUI), comprising the steps of:
   invoking a scan insertion tool through a scan insertion option of the graphical user interface to check a design for testability; and
   invoking a test generation tool through a test generation option of the graphical user interface to check the design for fault coverage.

9. The method of claim 8, wherein the test generation tool comprises an automatic test pattern generator (ATPG) tool.

10. The method of claim 8, further comprising the step of:
    accessing the scan insertion option or the test generation option through a design for test (DFT) menu.

11. Computer executable software code stored on a computer readable medium for testability operation, the code comprising:
    code to generate a scan insertion option to invoke a scan insertion tool to check a design for testability; and
    code to generate a test generation option to invoke a test generation tool to check the design for fault coverage.

12. The computer executable code of claim 11, wherein the test generation tool comprises an automatic test pattern generator (ATPG) tool.

13. The computer executable code of claim 11, further comprising:
    code to generate a scan insertion setup window to perform setup configuration for the scan insertion tool.

14. The computer executable code of claim 11, further comprising:
    code to generate a test generation setup window to perform setup configuration for the test generation tool.

15. The computer executable code of claim 11, further comprising:
    code to generate a design for test (DFT) menu to access the scan insertion option and the test generation option.

* * * * *